(12) United States Patent
Fitzpatrick et al.

(10) Patent No.: US 8,575,025 B2
(45) Date of Patent: Nov. 5, 2013

(54) TEMPLATED CIRCUITRY FABRICATION

(75) Inventors: David Fitzpatrick, Tara (IE); Kevin Dooley, Blessington (IE); Lorraine Byrne, Leixlip (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 207 days.

(21) Appl. No.: 13/193,580

(22) Filed: Jul. 28, 2011

(65) Prior Publication Data
US 2013/0029481 A1   Jan. 31, 2013

(51) Int. Cl.
*H01L 21/44* (2006.01)

(52) U.S. Cl.
USPC ..... 438/674; 438/599; 438/666; 257/E21.036

(58) Field of Classification Search
USPC .......... 438/408, 599, 666, 674, 678; 257/508, 257/775, E21.036; 205/118, 149; 427/405; 29/825
See application file for complete search history.

(56) References Cited

U.S. PATENT DOCUMENTS

| | | | |
|---|---|---|---|
| 5,298,687 A * | 3/1994 | Rapoport et al. | 174/261 |
| 6,620,726 B1 | 9/2003 | Preusse et al. | |
| 7,109,118 B2 | 9/2006 | Cohen et al. | |
| 7,152,215 B2 | 12/2006 | Smith et al. | |
| 7,195,989 B2 * | 3/2007 | Lockard et al. | 438/466 |
| 7,288,726 B2 * | 10/2007 | Chang | 174/261 |
| 7,323,094 B2 | 1/2008 | Simpson et al. | |
| 7,488,686 B2 | 2/2009 | Cohen et al. | |
| 7,636,139 B2 | 12/2009 | Rudin et al. | |
| 8,393,077 B2 * | 3/2013 | Byrne et al. | 29/847 |
| 2005/0189228 A1 | 9/2005 | Huang | |
| 2005/0212641 A1 * | 9/2005 | Hung et al. | 336/200 |
| 2006/0240668 A1 * | 10/2006 | Rudin | 438/678 |
| 2007/0033796 A1 | 2/2007 | Rudin | |
| 2007/0052019 A1 | 3/2007 | Rudin | |
| 2011/0063776 A1 * | 3/2011 | Byrne et al. | 361/323 |

* cited by examiner

Primary Examiner — James Mitchell
Assistant Examiner — Joseph C Nicely

(57) ABSTRACT

A method of making templated circuitry employs a template system that includes a template of an insulator material on a carrier having a conductive surface. The template includes multiple levels and multiple regions, wherein a first level exposes the conductive surface of the carrier. A first metal is electrochemically deposited on the conductive surface in first regions of the first level. A circuit material is deposited to cover the first metal. The template is etched until a second level of the template exposes the conductive surface in second regions on opposite sides of the first regions. A second metal is electrochemically deposited on the conductive surface in the second regions. The template of deposited materials is transferred from the carrier to a substrate.

16 Claims, 6 Drawing Sheets

TEMPLATED CIRCUITRY FABRICATION

CROSS-REFERENCE TO RELATED APPLICATIONS

N/A

STATEMENT REGARDING FEDERALLY SPONSORED RESEARCH OR DEVELOPMENT

N/A

BACKGROUND

In the field of macroelectronics, the production of active circuits on large area substrates is of interest in such technologies as displays, solar cells and sensor arrays, to name a few. The circuits included in displays, solar cells and sensor arrays include transistors, diodes, and conductor traces to interconnect the transistors and diodes, for example. A challenge in the production of large area multilayer circuits is manufacturing yield, as well as achieving low cost.

Templated electroforming is one method of manufacturing macroelectronic circuitry. However, deposition of various materials across the large areas of the substrates may tend to be non-uniform during the electrochemical deposition process. Further, etch rates of the various materials across the large area substrates may tend to be non-uniform during manufacturing as well. The non-uniformities of deposition and etching can lead to electrical shorts and opens in the macroelectronic circuitry that negatively impact yield and circuit durability.

BRIEF DESCRIPTION OF THE DRAWINGS

Various features of examples of the principles described herein may be more readily understood with reference to the following detailed description taken in conjunction with the accompanying drawings, where like reference numerals designate like structural elements, and in which.

Figure 1:
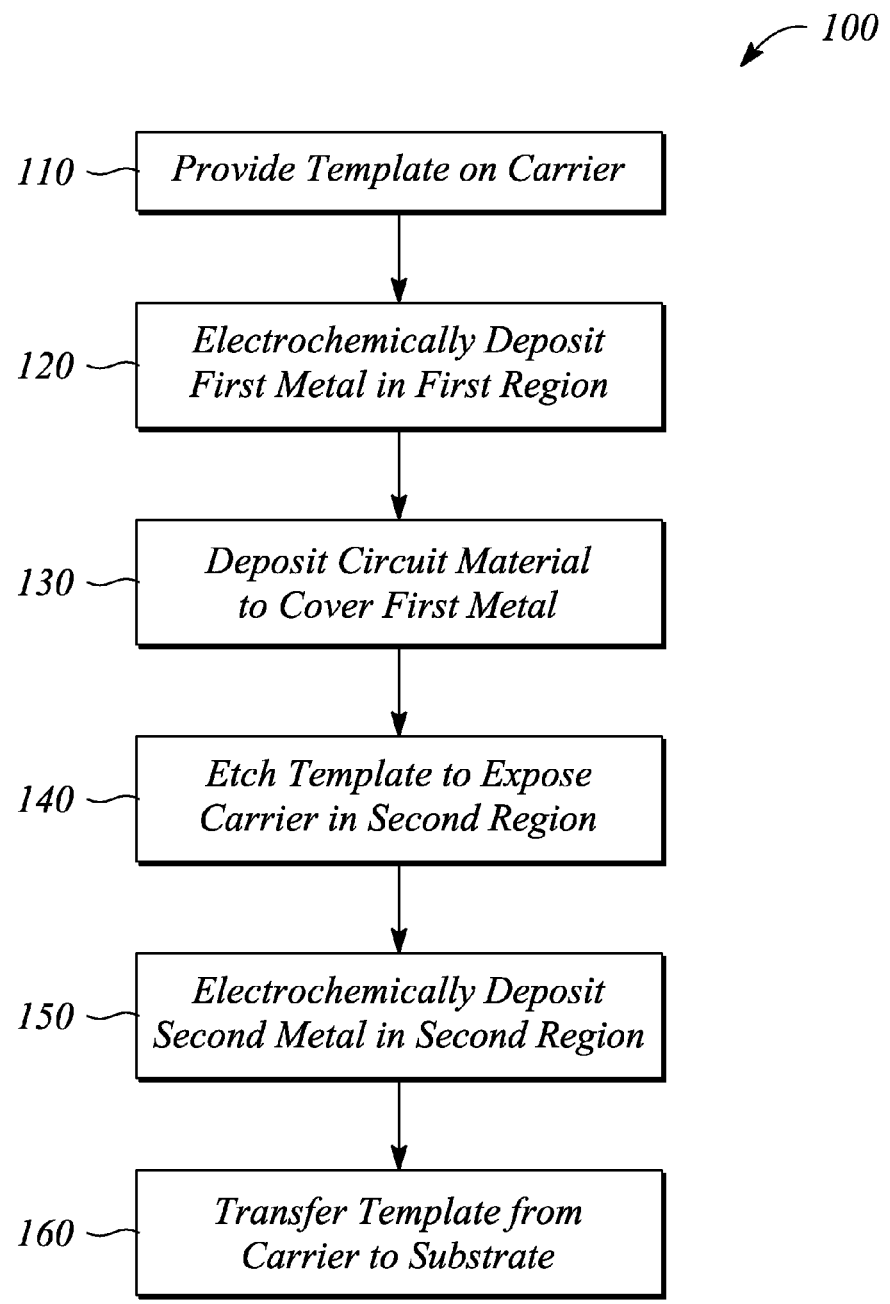
FIG. 1 illustrates a flow chart of a method of making templated circuitry according to an example in accordance with the principles described herein.

Certain examples have other features that are one of in addition to and in lieu of the features illustrated in the above-referenced figures. These and other features are detailed below with reference to the preceding drawings.

DETAILED DESCRIPTION

Examples in accordance with the principles described herein provide a self-aligned approach to manufacturing electronic circuitry with substantial uniformity throughout the circuitry. According to various examples, a method of making templated circuitry employs a template system and electrochemical deposition. The template system includes a three-dimensional (3-D) template having multiple levels and multiple feature regions associated with the multiple levels. The template is patterned with feature regions having substantially uniform sizes and substantially uniform distribution among the levels of the template. Electronic devices, crossovers, and conductor arrays form the circuitry that may be produced within the template system with substantial uniformity of circuit features throughout the templated circuitry, such that the circuits and arrays may have high yield in some examples.

In particular, both the feature size and the feature density influence deposition rates of circuit materials using electrochemical deposition during manufacturing. For example, a rate of electroplating of metals and electrophoretic deposition of polymer dielectrics into the feature regions of the multi-level template are both affected by localized current densities caused by the feature pattern of the template. In particular, an inverse relationship exists between metal electrodeposition rates and dielectric electrophoretic deposition rates in a high current density area. Electrodeposition of metals proceeds faster on average and electrophoretic deposition of dielectrics will deposit slower on average in the high current density areas. In addition, materials will deposit at a slower rate on small feature regions that are in proximity to relatively larger feature regions when compared to the small feature regions in isolation. Moreover, the localized current densities are affected by the feature region size and density for a given area. This effect is compounded during deposition into multiple levels of the template having varying feature region pattern densities.

Moreover, variations in feature size and feature density influence etch rates of the dielectric template and deposited dielectric circuit materials during manufacturing. In particular, large areas of exposed dielectric material will etch faster than relatively smaller areas of exposed dielectric material. As such, portions of the multi-level template may be etched to breakthrough prematurely during etching of the feature regions of the template. Subsequent deposition of circuit materials in these premature breakthrough areas puts circuit material where it is not targeted.

For example, in areas of high feature region density and large feature region size, a combined effect of reduced thickness of deposited dielectric circuit material and higher etch rates result in deposited dielectric circuit material being removed during etching of the template feature regions. Subsequent deposition of metal circuit materials in these regions will result in electrical shorts in the manufactured templated circuit. In another example, in areas of low feature region density and small feature region size, slower etch rates result in incomplete etching to breakthrough of the template dielectric where breakthrough has been targeted. In some areas of the template, subsequent deposition of metal circuit materials in these regions will result in electrical opens in the manufactured templated circuit. In other areas of the template, applying additional etching time to accommodate the slower etch rate will remove dielectric from large surface regions such that subsequent deposition of metal circuit materials in these large surface regions will result in electrical shorts in the manufactured templated circuit. In addition, deposited circuit material in relatively large feature regions, for example those used for bond pads and contact pads, may suffer from premature lift off or loss of adhesion to the conductive carrier during circuit manufacture, for example, due to the relatively larger feature size.

As such, according to an example of the principles described herein, the multi-level template has substantially uniform size feature regions and substantially uniform distribution of feature regions on respective levels that facilitate providing templated circuitry having circuit features of substantially uniform thickness. The circuit features comprise operational features, non-operational features and redundant features. In some examples, the operational features comprise one or more of passive circuit elements, active circuit elements and crossover elements. In some examples, the active circuit elements comprise one or both of thin film transistors (e.g., field effect transistors or bipolar junction transistors) and diodes. In some examples, the passive circuit elements comprise one or more of conductor traces, resistors, capacitors, and inductors. In some examples, the operational features of the multi-level templated circuit comprise one or both of an array of crossover elements and an array of thin film transistors.

The term 'electrochemical deposition' as used herein is a term that means one or more of electroplating, electrodeposition, electroless deposition and electrophoretic deposition.

The term 'uniform' and 'uniformity' as used herein means substantially consistent or without substantial variation. For example, 'uniform deposition' means a substantially constant deposition thickness. In another example, 'uniform distribution' or 'uniform density' means distributed substantially evenly. In another example, 'uniform size' means a size dimension that is substantially consistent. As such, the terms 'uniform' and 'substantially uniform' as used herein have the same meaning.

The term 'substantially' as used herein means predominantly. In some examples, 'substantially' means a majority; in other examples, 'substantially' may include 'entirely' within its scope.

The term 'multi-level' as used herein means a plurality of surface levels that coexist in a three-dimensional template that facilitates the manufacture of templated circuitry.

The term 'templated' as used herein means formed with a template that is an integral part of a circuit or circuitry. The term 'circuit' or 'circuitry' as used herein means one or more of conductor traces, crossovers, active devices and passive devices.

The term 'operational feature' as used herein means a circuit feature that actively or passively contributes to an electrical function of the circuit. The term 'nonoperational feature' as used herein means a circuit feature that does not contribute to an electrical function of the circuit. The term 'redundant feature' as used herein means a backup or reserve operational feature.

As used herein, the article 'a' is intended to have its ordinary meaning in the patent arts, namely 'one or more'. For example, 'a material' means one or more materials and as such, 'the material' explicitly means 'the material(s)' herein. Also, any reference herein to 'top', 'bottom', 'upper', 'lower', 'up', 'down', 'front', 'back', 'first', 'second', 'left' or 'right' is not intended to be a limitation herein. Herein, the term 'about' when applied to a value may mean that the value is within normal tolerances of a measurement technique or equipment used to generate the value. Any ranges of values provided herein include values and ranges within or between the provided ranges. Moreover, examples herein are intended to be illustrative only and are presented for discussion purposes and not by way of limitation.

FIG. 1 illustrates a flow chart of a method 100 of making a templated circuitry according to an example of the principles described herein. The method 100 comprises providing 110 a template on a conductive surface of a carrier. The template is a three-dimensional template made of an insulator material that is patterned with multiple levels and multiple feature regions associated with the multiple levels. A first level of the template exposes the conductive surface of the carrier. The feature regions have uniform size and uniform distribution on respective levels of the multi-level template to facilitate improved circuit yield during manufacturing. For example, the feature regions include respective elongate regions with one or both of respective similar length and respective similar width.

The conductive carrier is a substrate or plate that has a conductive surface. In some examples, the substrate is a planar stainless steel plate or other conductive metal plate, and the conductive surface comprises a layer of a low resistivity metal, including but not limited to, copper, nickel, gold, silver, a combination of two or more thereof, or an alloy comprising one or more of the above, which is coated on a surface of the carrier. The template is formed on the conductive surface of the conductive carrier. In some examples, the template is formed from a polymeric dielectric material including, but not limited to, a UV curable polymeric resist material or a thermally curable polymer film. For example, SU-8 is an epoxy-based, near-UV, negative photoresist available from Micro-Chemical Corporation that may be used as the insulator material of the template. The multiple levels and multiple feature regions of the template are patterned in the 3-D template using one or more of photolithography, UV embossing, hot embossing, nanoimprint lithography, and laser patterning, for example.

Figure 2A:
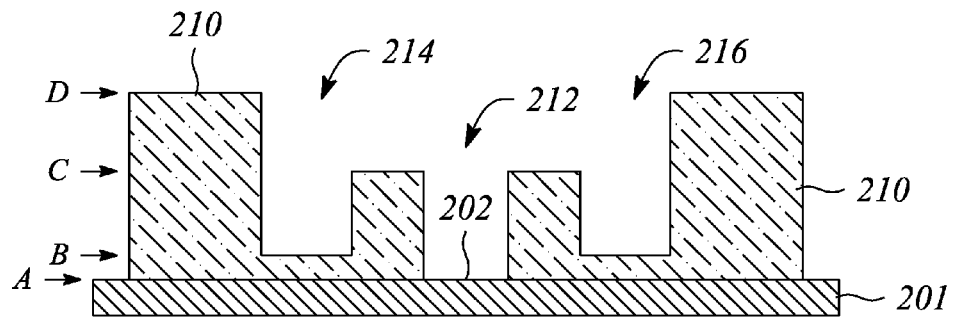
FIGS. 2A-2I illustrate cross-sectional views of templated circuitry during manufacturing according to the method illustrated in FIG. 1 according to examples in accordance with the principles described herein.

FIGS. 2A-2I illustrate cross-sectional views of multi-level templated circuitry during manufacturing according to the method 100 illustrated in FIG. 1 in accordance with various examples of the principles described herein. FIG. 2A illustrates a cross-sectional view of the template 210 provided 110 on a conductive carrier 201 according to some examples. The template 210 has multiple levels (e.g., A, B, C, D) and multiple feature regions, where only three feature regions 212, 214, 216 are illustrated in FIGS. 2A-2I for simplicity of illustration only.

Figure 2B:
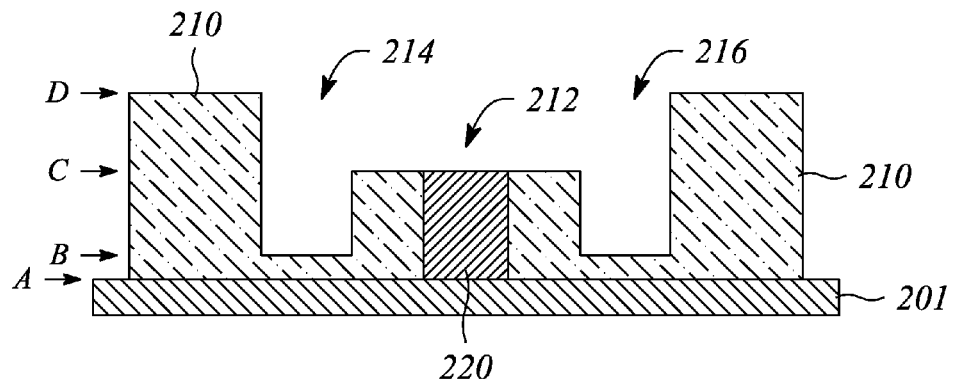

Referring back to FIG. 1, the method 100 of making templated circuitry further comprises depositing 120, using an electrochemical deposition process, a first metal material on the conductive surface in first regions of the first level where the conductive carrier surface is exposed. FIG. 2B illustrates a cross-sectional view of the template 210 having a first metal material 220 deposited 120 in a first feature region 212 in contact with the conductive surface 202 of the carrier 201 at the first level A according to some examples. The first metal material 220 is deposited to a third level C of the multi-level template in FIG. 2B, by way of example.

Figure 2C:
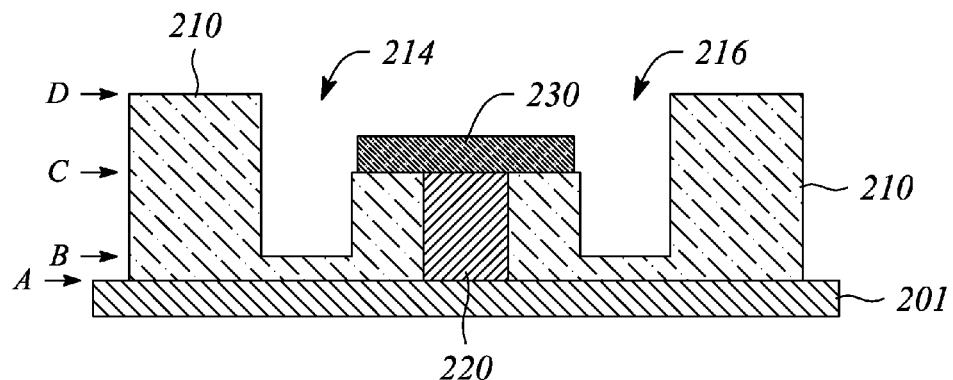

The method 100 of making templated circuitry further comprises depositing 130 a circuit material on the first metal to cover the first metal. The circuit material is a material that is different from the first metal. The circuit material is deposited 130 to a thickness that takes into account that a surface part thereof may be subsequently etched, as described further below. In some examples, the deposition 130 of the circuit material is selective and in some examples, occurs by either electrophoretic deposition or inkjet deposition directly on an exposed surface of the first metal. FIG. 2C illustrates a cross-sectional view of the template 210 having a layer of a circuit material 230 deposited at the level C of the template 210 to cover the first metal 220 and in some examples, to cover a portion of the template 210 surface at the level C, according to some examples. As used herein, a 'portion' includes within its scope either less than all or all of the respective surface or material. Further illustrated in FIG. 2C are template regions 214, 216 at second level B of the template 210. In some examples, the circuit material may be a material used to insulate or mask the first metal material from subsequently deposited materials.

Figure 2D:
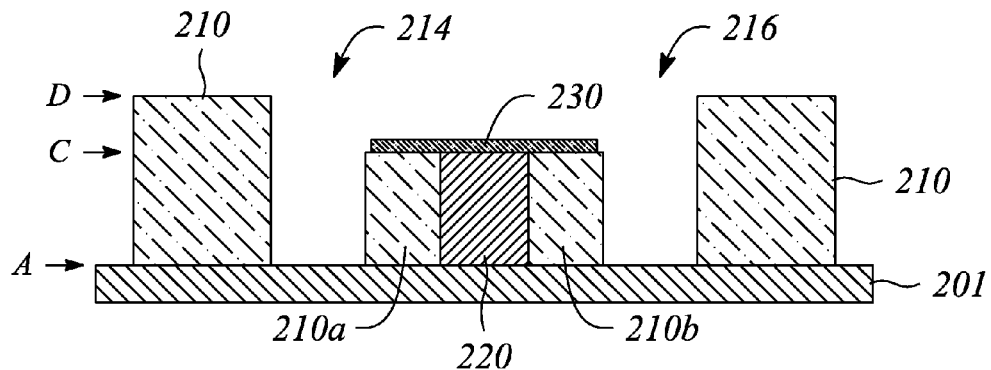

The method 100 making templated circuitry of FIG. 1 further comprises etching 140 the template until a second level of the template exposes the conductive surface of the carrier in second regions on opposite sides of and spaced from the first feature region. In some examples, the template may be etched 140 using a dry etching technique including, but not limited to, one or more of plasma etching, reactive ion etching, laser ablation, focused ion beam etching and electron beam etching. In some examples, a surface part of the deposited 130 circuit material is also removed during etching 140 the template. FIG. 2D illustrates a cross-sectional view of the template 210 after etching 140, wherein the template material at level B corresponding to second regions 214, 216 is removed to expose the conductive surface 202 of the carrier 201, according to some examples. In this cross-sectional view, template parts 210a and 210b appear isolated from the template 210 as a result of etching 130 the template in the second regions 214, 216. Also illustrated in FIG. 2D, by way of example, is that the layer of circuit material 230 is thinner as compared to its thickness illustrated in FIG. 2C, as a result of etching 140.

Figure 2E:
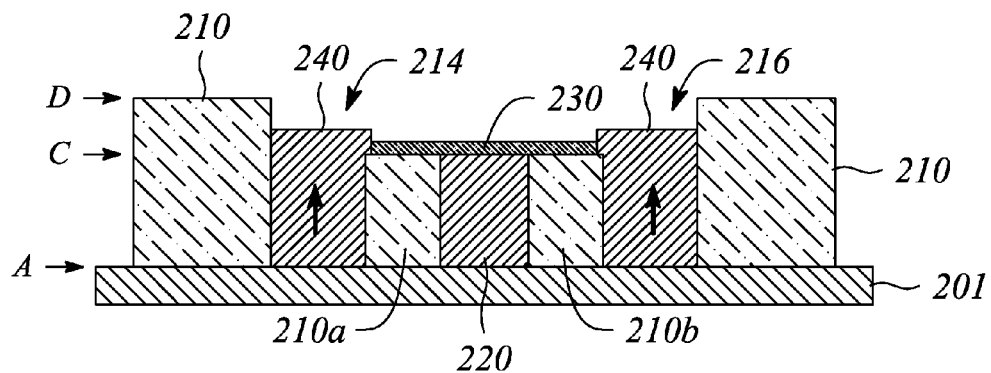

The method 100 of making templated circuitry further comprises depositing 150 a second metal on the exposed conductive surface of the carrier in the second regions using electrochemical deposition. The second metal is a different material from the circuit material. FIG. 2E illustrates a cross-sectional view of the template 210 having a second metal 240 deposited 150 in second regions 214, 216 on opposite sides of the templated first metal 220, according to some examples. In particular, the template parts 210a and 210b on opposite sides of the first metal 220 space apart and insulate the first metal 220 from the second metal 240 in respective adjacent second regions 214 and 216, as illustrated in FIG. 2E. Not illustrated in FIG. 2E is that, in some examples, the second metal 240 is deposited 150 to overlap a portion of the circuit material 230 from opposite sides of the first metal region 212. By 'portion' of the circuit material 230 herein, it is meant either less than all or all of the circuit material 230, depending on the example. As such, in some examples, the second metal is deposited 150 to either form an electrically conductive bridge across or over the deposited 130 circuit material or leave a gap over the deposited 130 circuit material. In some examples, the gap is substantially aligned with the deposited 120 first metal.

Referring again to FIG. 1, the method 100 of making templated circuitry further comprises transferring 160 the template of the deposited materials from the carrier to a substrate to form the templated circuitry. In some examples, the transfer 160 comprises exposing a side of the templated circuit materials adjacent to the conductive carrier. In some examples, transferring 160 the template of deposited materials comprises attaching the substrate to an exposed surface of the template of deposited materials (e.g., at template level D) with an adhesive; and removing the conductive carrier to expose an opposite surface of the template of deposited materials. The substrate may be attached with adhesive by a lamination process, for example by using a pressurized roller which may be either heated or cooled with a subsequent ultra-violet (UV) exposure or heat treatment to cure the adhesive. In some examples, the adhesive may be conformally coated onto the exposed surface of the template of deposited materials and the substrate is placed in contact with the adhesive coated surface. Removal of the conductive carrier may be achieved using a peel-off transfer process, for example.

The material of the substrate includes, but is not limited to, glass, a ceramic material, and a plastic or other polymeric material, for example. In some examples, the substrate material may be a low temperature material (e.g., withstands <150° C.) or a high temperature material (i.e., withstands >150° C.). Moreover, the substrate material may be flexible, rigid or semi-rigid, and either optically transparent, translucent, or optically non-transparent or opaque. The adhesive includes, but is not limited to, a UV-curable polymer adhesive including, but not limited to, polyacrylates or an epoxy, for example, a pressure sensitive adhesive film or a thermally curable adhesive. The adhesive may be applied either in dry film format using a pressurized lamination roller or as a liquid film by standard liquid coating techniques. In some examples, the adhesive is optically transparent, translucent or opaque.

Figure 2F:
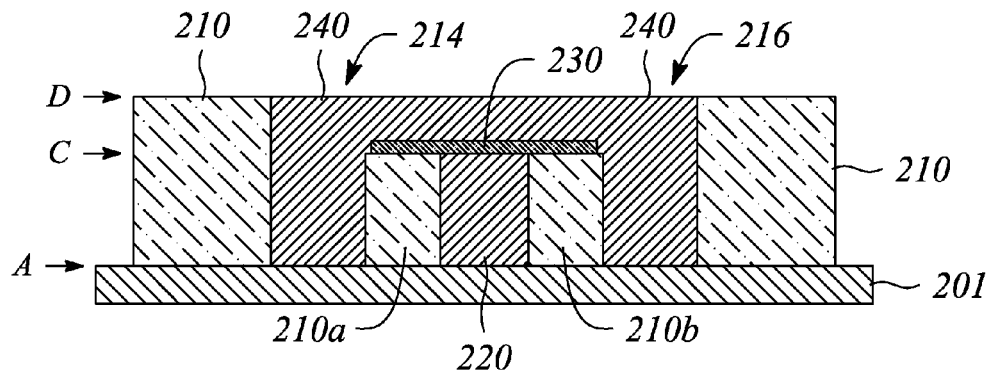

As mentioned above, in some examples of the method 100 of making templated circuitry, the second metal is deposited 150 to form an electrically conductive bridge across the deposited 130 circuit material from the opposite sides of the templated first metal region. FIG. 2F illustrates the template 210 having the second metal 240 deposited to at least a level D of the template wherein the second metal 240 further bridges across the circuit material 230 to connect from the second regions 214, 216 on opposite sides of the insulated first metal 220, according to some examples. While the deposited 150 second metal 240 is illustrated in FIG. 2F as being relatively planar with the template level D, by way of example; in some examples, the second metal 240 may be deposited 150 to either greater than or less than the template level D and have a substantially convex or concave profile in cross-section, respectively, for example.

Figure 2G:
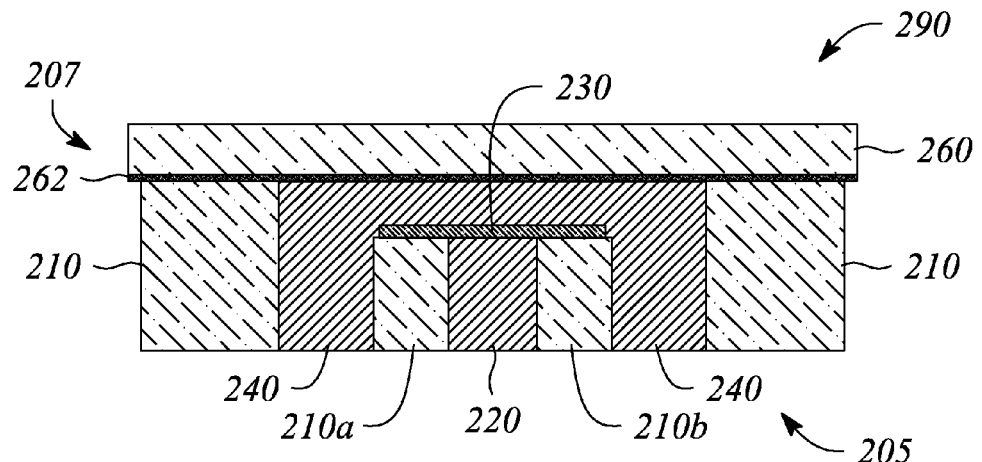

FIG. 2G illustrates a cross-sectional view of templated circuitry 290 made by the method 100, according to some examples, wherein the template of deposited materials has been transferred 160 from the carrier 201 to a substrate 260. In particular, the conductive carrier 201 has been removed from a side 205 of the template of deposited materials (e.g., at level A) that was adjacent to the conductive carrier 201; and a substrate 260 is attached with an adhesive 262 to an opposite side 207 (e.g., at level D) of the template of deposited materials. The exposed side 205 or surface of the template of deposited materials is characteristically planar due to the templated method 100 of forming the circuitry on a sacrificial planar conductive carrier 201. The templated circuitry 290 illustrated in FIG. 2G comprises one of a crossover, a resistor, a capacitor and a diode, for example, and depends on the types of circuit materials 230 that are deposited 130 during the method 100, which are described further below. In some examples, the templated circuitry 290 illustrated in FIG. 2G comprises an array of such circuitry on a large area substrate (not illustrated). Moreover, in each of the resistor, the capacitor and the diode device examples, the respective device terminals are the first metal 220 region and either or both of the second metal 240 regions.

Figure 2H:
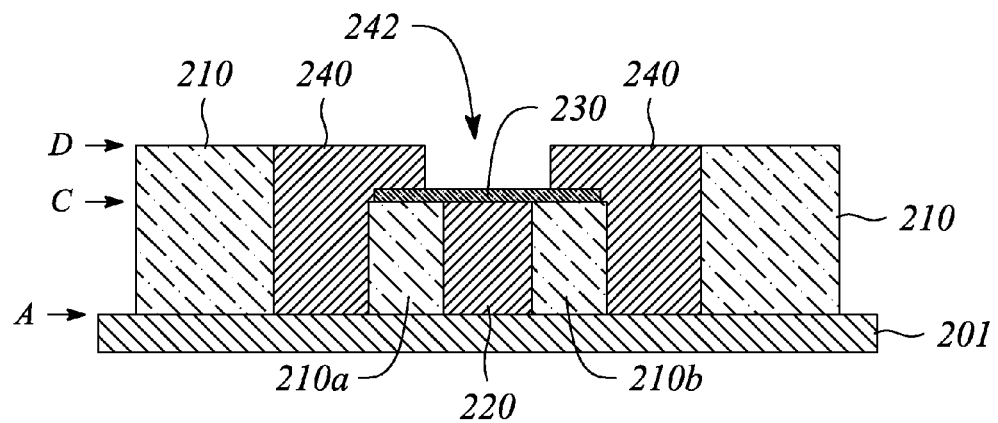

Also as mentioned above, in other examples of the method 100 of making templated circuitry, the second metal is deposited 150 in the second regions such that a gap between the second metal from the second regions on opposite sides of the first metal region (i.e., 'templated first metal' or 'insulated first metal') remains over the deposited 130 circuit material. The gap leaves exposed a surface portion of the deposited 130 circuit material. In some examples, the gap is approximately vertically aligned with the first metal region. FIG. 2H illustrates the template 210 having the second metal 240 deposited, such that a gap 242 is left or formed between the second metal regions 214, 216 on opposite sides of the insulated first metal 220, according to some examples. Moreover, FIG. 2H illustrates the second metal 240 deposited to at least the level D of the template 210. While the deposited second metal 240 is illustrated in FIG. 2G as being relatively planar with the template level D, by way of example; in some examples, the second metal 240 may be deposited 150 to either greater than or less than the template level D in the respective second regions 214, 216 and have a substantially convex or concave profile in cross-section, respectively.

Figure 2I:
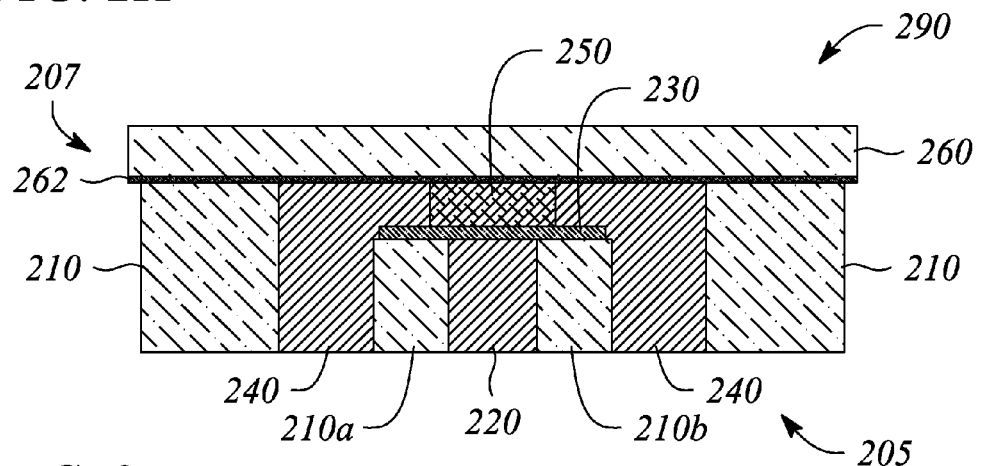

In some of these examples, the method 100 of making templated circuitry further comprises depositing a device material into the gap (not illustrated in FIG. 1). The device material may be deposited using a selective deposition technique, for example inkjet printing, or slot coating or spray coating through a mask, for example. The device material is a different material from the circuit material. FIG. 2I illustrates a cross-sectional view of another example of templated circuitry 290 made by the method 100, according to some examples. In particular, the gap 242 is filled with a device material 250 and the conductive carrier 201 has been removed from the side 205 of the template 210 of deposited materials (e.g., at level A) that was adjacent to the conductive carrier 201; and the substrate 260 is attached with the adhesive 262 to the opposite side 207 (e.g., at level D) of the template of deposited materials. The exposed side 205 of the template of deposited materials is also characteristically planar due to the templated method of forming the circuitry on a sacrificial planar conductive carrier 201, as mentioned above. The templated circuitry 290 illustrated in FIG. 2I comprises one of a resistor, a diode or a transistor, which depends on the types of circuit material 230 and device material 250, which are described further below, that are deposited during the method 100. In some examples, the templated circuitry 290 illustrated in FIG. 2I further comprises a conductor trace electrically isolated from a resistor or a diode. In some examples, the templated circuitry 290 is an array of such circuitry on a large area substrate (not illustrated).

The circuit material 230 and the device material 250 are separately deposited 130, 150 using one or more of electrochemical deposition facilitated (either directed or indirectly) by the conductive carrier and the first metal, slot coating, spray deposition and inkjet printing, for example. In some examples, one or both of circuit material 230 and the device material 250 is selectively deposited.

In some examples, the first metal 220 and the second metal 240 are electrically conductive materials that may be the same or different. The first and second metals 220, 240 independently include, but are not limited to, copper, silver, gold, palladium, platinum, aluminum, a combination of one or more of these metals with another material, or an alloy of one of these metals.

In some examples, the circuit material 230 that is deposited on the first metal 220 is an insulator material including, but not limited to, polymer films such as polyacrylates, epoxies, polyurethanes or similar insulating oxide, nitride or carbide films of materials such as aluminum, silicon or titanium, or composite films of nanoparticles of inorganic insulators in a polymer matrix, for example. In some examples, the circuit material 230 that is deposited on the first metal 220 is a resistive material including, but not limited to, nickel phosphide, conducting polymer films such as poly(3,2-ethylenedioxythiophene:poly(styrenesulfonate) (PEDOT:PSS), or composites of carbon particles in a polymer matrix. In some examples, the circuit material 230 that is deposited on the first metal 220 is a high dielectric constant dielectric material including, but not limited to, oxides or silicates of hafnium, zirconium, or tantalum, for example. In some examples, the circuit material 230 that is deposited on the first metal 220 is a semiconductor material, including doped semiconductor materials to form a semiconductor junction in the deposited circuit material, for example a horizontally stacked or layered semiconductor junction. A variety of semiconductor materials may be used including, but not limited to, semiconducting polymer films such as pentacene, polypyrrole, polythiophene or polyaniline; a semiconducting nanomaterial such as semiconducting carbon nanotubes; or a Group IV semiconductor (e.g., silicon) or a compound semiconductor of Groups IV, III-V, or Groups II-VI of the Periodic Table of Elements.

In some examples, the device material 250 illustrated in the gap 242 of FIG. 2I may be one of the resistor materials described above, or another resistive material; or may be a semiconductor material, such as any of those described above, or another semiconductor material. Moreover, in some examples, the semiconductor material may be doped to provide a semiconductor junction in the gap 242, depending on the templated circuitry to be made.

For example, the templated circuitry 290 illustrated in FIG. 2I may be a thin film transistor (TFT), for example a field effect transistor (FET), according to some examples. In this example, the circuit material 230 is an insulator material, the device material 250 in the gap 242 is a semiconductor material, the second metal 240 in second region 214 is a source and the second metal 240 in second region 216 is a drain, for example, and the first metal 220 in first region 212 is a gate of the FET, according to some examples.

In another example, the templated circuitry 290 illustrated in FIG. 2I may be a resistor and an isolated conductor trace, according to some examples. In this example, the device material 250 in the gap 242 is a resistive material; and the second metal 240 in the second regions 214, 216 form separate terminals of the resistor. Moreover, in this example, the first metal 220 in first region 212 is a conductor trace that is electrically isolated from the resistor, according to some examples.

In another example, the templated circuitry 290 illustrated in FIG. 2I may be a diode, according to some examples. In this example, the circuit material 230 is an insulator material, the device material 250 in the gap 242 is a doped semiconductor material to provide a semiconductor junction, and the second metal 240 in the second regions 214, 216 form separate terminals of the diode. In particular, the semiconductor material 250 in the gap may be doped to form a vertically stacked or aligned n-p or p-n semiconductor junction. Moreover, in this example, the first metal 220 in first region 212 is a conductor trace that is electrically isolated from the diode, according to some examples. The isolated conductor trace in these examples may provide an interconnection to other areas (not illustrated) of the templated circuitry 290, for example.

In others of these examples (not illustrated), the method 100 of making templated circuitry further comprises selectively removing the circuit material 230 (illustrated in FIG. 2H) that is exposed in the gap 242 to expose the underlying first metal 220. For example, the circuit material 230 may be an insulator mask material that is removed with reactive ion etching or laser ablation, for example. After the circuit material 230 is removed from the gap 242, a device material 250 is selectively deposited in the gap 242 to interface with the first metal 220. In particular, a semiconductor material may be deposited in the gap and further may be doped to form a semiconductor junction, for example a vertically aligned n-p-n type or p-n-p type semiconductor junction. In this example, the template circuitry 290 may be a bipolar junction transistor (BJT), where one of the second metal 240 regions 214, 216 is an emitter of the BJT, another of the second metal 240 regions 216, 214 is a collector of the BJT, and the first metal 220 region 212 is a base of the BJT.

According to some examples of the principles described herein, the templated circuitry 290 comprises operational features, non-operational features and redundant features with respective uniform thicknesses. By 'features' it is meant circuit elements, device elements or circuits. The various features have respective uniform thicknesses due to the feature regions of the multi-level template having uniform sizes and a uniform distribution on respective levels of the multi-level template, according to some examples. The uniformity provided by the template may facilitate improved manufacturing yield of the multi-level templated circuit.

Figure 3:
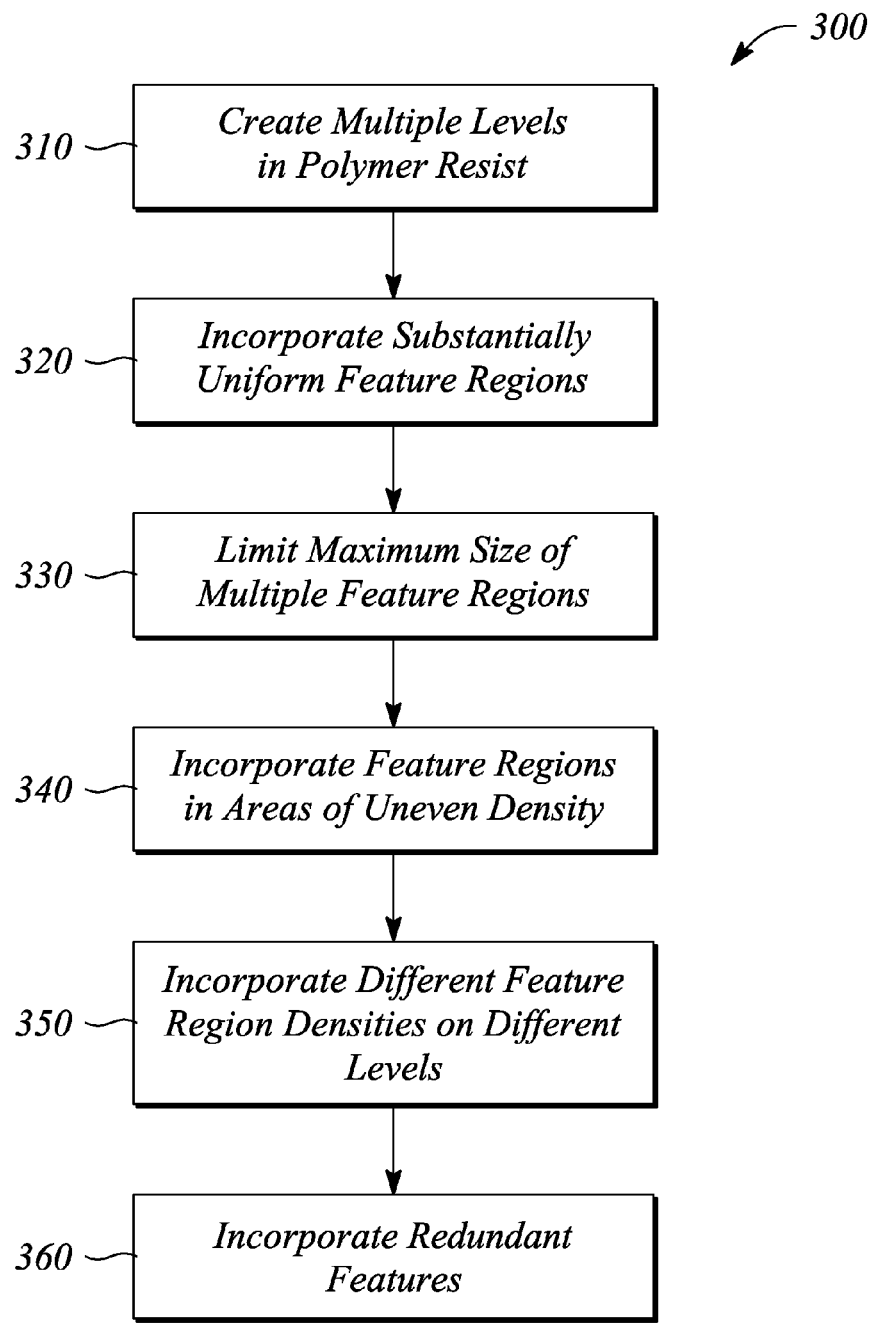
FIG. 3 illustrates a flow chart of a method of patterning a template according to another example in accordance with the principles described herein.

To achieve the uniformity in circuit features of the templated circuitry described herein, the template is patterned. FIG. 3 illustrates a flow chart of a method 300 of patterning a template according to an example of the principles described herein. The method 300 of patterning comprises incorporating 320 substantially uniformly sized feature regions per level of multiple levels created 310 using a polymeric resist material, wherein the multiple levels comprise multiple feature regions. The method 300 of patterning further comprises limiting 330 a maximum size of the multiple feature regions, such as bond pads and contact pads, using segmentation of large feature regions into an interconnected array of relatively smaller feature regions. Limiting 330 the maximum size of feature regions facilitates maintaining the uniform size of the multiple feature regions throughout the multi-level template. Maintaining uniform feature region size facilitates deposition uniformity of circuit materials and may reduce variations in etch rate during templated circuitry manufacturing. Moreover, the segmentation of large feature regions may facilitate circuit material adhesion.

Figure 4A:
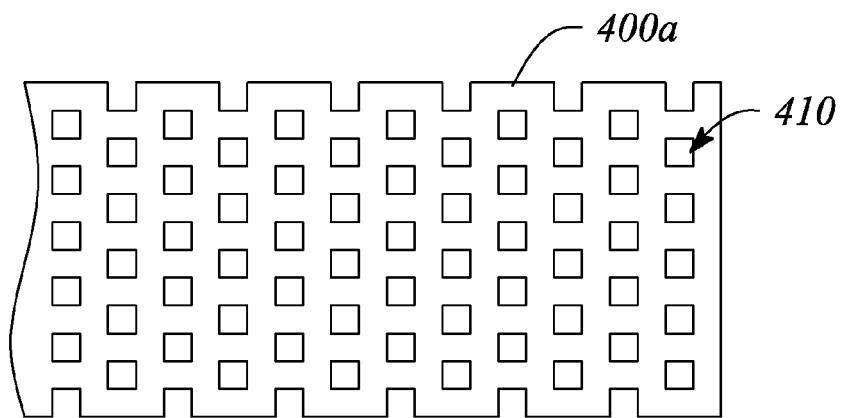
FIGS. 4A-4B illustrate top views of segmented large feature regions according to examples in accordance with the principles described herein.
Figure 4B:
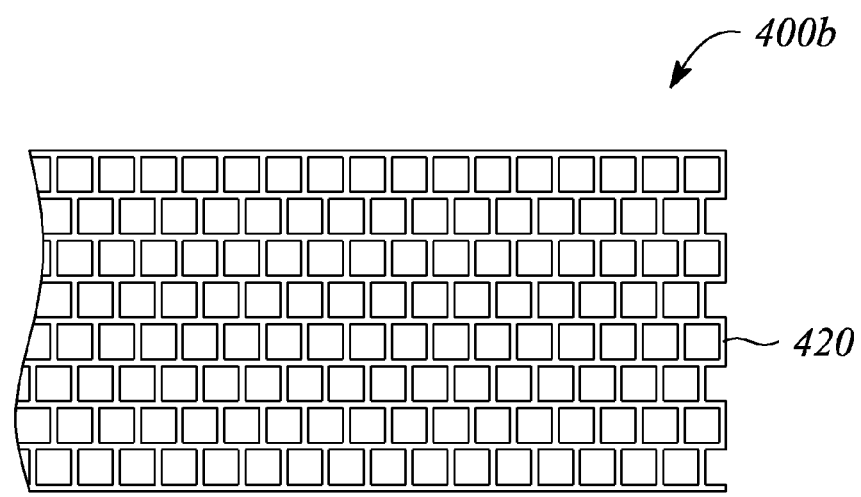

In some examples, segmentation of large feature regions, such as bond pads and contact pads, to reduce individual feature areas to more uniform sizes increased uniformity in deposition and etch rates and reduced adhesion problems associated with large features of circuit material during manufacturing. FIGS. 4A and 4B illustrate top views of segmented large feature regions according to an example of the principles described herein. FIG. 4A illustrates a segmented bond pad 400a that incorporates a pattern of holes 410 according to an example. FIG. 4B illustrates a segmented bond pad 400b that incorporates a patterned metal mesh 420 according to an example. Both examples 400a, 400b exhibited uniform current densities, uniformity in deposition and etch rates and in some examples, no observed dielectric breakdown effects and no lift off.

In some examples, maintaining all individual feature regions to less than 10 microns in width may provide for uniform electrochemical deposition and etch rates. In some examples, crossover features made with first level metal material covered with dielectric circuit material prior to deposition of second level metal material had feature widths constrained to a range of about 5 microns to about 7 microns wide to provide uniform deposition thicknesses of metal and dielectric circuit materials. In some examples, the second level metal crossover 'T' further had radii constrained to a range of about 2 microns to about 5 microns to avoid premature breakthrough at the center of the crossover 'T' during etching, for example.

The method 300 of patterning further comprises incorporating 340 feature regions in areas of uneven feature region density to produce a substantially even feature region density per level of the multiple levels. In some examples, non-operational features are incorporated 340 in areas of low feature region density per level of the multi-level template to facilitate substantially a uniform distribution (i.e., density) of the features of comparable size on each level. The uniform distribution of the features achieved with incorporation of non-operational features effectively evens out the distribution of current during templated circuitry manufacturing, for example. Areas that would otherwise have high current density during manufacturing of the templated circuitry are shifted to having a more evenly distributed current density to facilitate the manufacturing of the templated circuitry.

In some examples, non-operational feature regions were placed on respective levels of the multi-level template to substantially match a two-dimensional (2-D) pattern density of each level within the template substantially without interference with features on successive levels in the template. For example, in a 40×40 crossover array circuit, the first level of feature regions of the template, which would have both metal circuit material and dielectric circuit material overlay after deposition, had a feature density in a center portion of the array of about 5%. Non-operational feature regions of about 10×10 microns were inserted all around the first level in a density of about 5%. Placement of these non-operational feature regions were so that they did not impinge on second level feature regions, which would have metal circuit material after deposition. Further in this example of the 40×40 crossover array, the second level of feature regions had a feature density of about 8%. Non-operational feature regions of about 10×10 microns were inserted around the 2-D feature pattern of the second level to match the 8% density, but arranged so to not interfere with the features of the first level.

In some examples, the method 300 of patterning a template further comprises incorporating 350 different feature region densities on respective different levels of the multi-level template. The different feature region densities are incorporated 350 by including non-operational features across multiple levels to provide a benefit for all levels in the template. For example, first level non-operational feature regions will expose the conductive carrier surface and will receive deposited metal material then dielectric material during deposition and remain electrically isolated. Second level non-operational feature regions will have an underlying layer of the dielectric (or insulator) circuit material and therefore not expose the conductive carrier surface during this first level deposition. During subsequent etching of the template, the underlying layer of the non-operational feature regions is etched, but not the first level non-operational feature regions. As such, subsequent deposition of second metal material will occur only in the second level non-operational features for the uniformity of features in the second level.

In some examples, the method 300 of patterning a template further comprises incorporating 360 redundant feature regions on the multiple levels of the template. The redundant features may be operational features that are electrically vulnerable or physically vulnerable (e.g., to particle or other contamination). For example, crossover arrays where fine conductor traces overlap other fine conductor traces with a layer of dielectric insulation between are subject to shorts or opens if particle contamination is present during manufacturing. To avoid an electrical failure of an entire row or an entire column of the crossover array and to build in tolerance, redundant rows or columns were incorporated. The redundancy facilitated improved electrical yield in a multi-level templated circuit of crossover arrays.

According to another example of the principles described herein, a template system is provided. The template system comprises a carrier having a conductive surface. In some examples, the carrier is a planar sheet of a rigid or semi-rigid material, such as stainless steel or another metal material that provides a sacrificial support for templated circuitry manufacturing. In some examples, the conductive surface of the carrier comprises a layer of copper, nickel, or another low resistivity material deposited on the carrier.

The template system further comprises a three-dimensional (3-D) template on the conductive surface of the carrier. The template is made from an insulator material, for example a polymer including, but not limited to a polymer resist material applied to and patterned on the conductive surface of the carrier. The template comprises multiple levels and multiple feature regions associated with the multiple levels. FIG. 2A illustrates a cross-sectional view of the template system (e.g., carrier 201 and template 210) according to any of the examples described herein. In particular, the multiple feature regions of the template comprise interconnected arrays of small feature regions to represent relatively large feature regions (see FIGS. 4A and 4B). The arrays of small feature regions facilitate maintaining substantially uniform feature region sizes throughout the template. In addition, the multiple feature regions are distributed across each level of the multiple levels to provide substantially uniform region density per level of the template. Moreover, the multiple feature regions have different region densities on different levels of the template. In addition, the multiple feature regions have redundant feature regions throughout the template to accommodate a variety of vulnerable electronic circuits. In some examples, the multiple feature regions are to provide circuit features of uniform size and uniform distribution across the respective levels of the template of templated circuitry manufactured with the template system.

In some examples, the template is made from a material suitable for becoming an integral part of an electronic circuit. For example, the template material may provide an insulator pattern between circuit features of the electronic circuit. In some examples, the template material is a polymer resist material, for example SU-8 or another polymer resist material. SU-8 is an epoxy-based, near-UV, negative photoresist available from Micro-Chemical Corporation, for example.

In some examples, the template comprises first feature regions at a first level of the template that expose the conductive surface of the carrier for a first deposition process, for example an electrochemical deposition process. The template further comprises a second level that covers the conductive surface and provides etchable regions to subsequently expose the conductive surface for another deposition process after the first deposition process, for example. The first and subsequent deposition processes include, but are not limited to, one or more of electrochemical deposition, slot coating, spray deposition and inkjet printing, for example.

The template system is used to manufacture a templated circuitry comprising operational circuit elements, non-operational circuit elements and redundant circuit elements. In some examples, the template system is substantially similar to the template 210 and carrier 201 used in the method 100 of making a templated circuitry, according to any of the examples described above.

Thus, there have been described examples of a method of templated circuitry manufacture using a template system having a patterned template. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A method of making templated circuitry, the method comprising:
    providing a template on a conductive surface of a carrier, the template being an insulator and comprising multiple levels and multiple regions associated with the multiple levels, a first level of the template exposing the conductive surface;
    electrochemically depositing a first metal on the conductive surface in first regions of the first level;
    depositing a circuit material to cover the first metal;
    etching the template until a second level of the template exposes the conductive surface in second regions on opposite sides of and spaced from the first regions;
    electrochemically depositing a second metal on the conductive surface in the second regions; and
    transferring the template of deposited materials from the carrier to a substrate.

2. The method of making templated circuitry of claim 1, further comprising patterning the template, wherein patterning the template comprises:
    incorporating regions of substantially uniform size on the multiple levels;
    limiting a maximum size of the multiple regions using segmentation of large regions into an interconnected array of relatively smaller regions;
    incorporating non-operational regions on respective levels to produce a substantially uniform region density per level;
    incorporating different region densities on different levels; and
    incorporating redundant regions on the multiple levels.

3. The method of making templated circuitry of claim 2, wherein the template is formed in a polymeric resist material using one or more of photolithography, embossing, nanoimprint lithography and laser patterning.

4. The method of making templated circuitry of claim 1, wherein the circuit material is deposited using one or more of electrochemical deposition, slot coating, spray deposition and inkjet printing.

5. The method of making templated circuitry of claim 1, wherein the second level of the template is etched using plasma etching.

6. The method of making templated circuitry of claim 1, wherein transferring the template of deposited materials comprises:
    attaching the substrate to an exposed surface of the template with an adhesive; and
    removing the carrier to expose an opposite surface of the template.

7. The method of making templated circuitry of claim 1, wherein the substrate is one or both of flexible and transparent.

8. The method of making templated circuitry of claim 1, wherein the electrochemically deposited second metal forms an electrically conductive bridge across the circuit material from the opposite sides of the first region.

9. The method of making templated circuitry of claim 8, wherein the circuit material is one of an insulator material, a resistive material, and a high dielectric constant dielectric material, the circuitry comprising a respective one of a crossover, a resistor, and a capacitor.

10. The method of making templated circuitry of claim 8, wherein the circuit material is a semiconductor material, the circuitry comprising a diode, and wherein depositing the circuit material comprises doping the semiconductor material to create a horizontally stacked semiconductor junction.

11. The method of making templated circuitry of claim 1, wherein the electrochemically deposited second metal from the second regions on the opposite sides of the first region leaves a gap over the circuit material.

12. The method of making templated circuitry of claim 11, wherein the circuit material is an insulator material, the method further comprising depositing a device material to fill the gap.

13. The method of making templated circuitry of claim 11, wherein the device material is a resistive material, the circuitry comprising a resistor and first region conductor traces at the first level insulated from the resistor.

14. The method of making templated circuitry of claim 11, wherein the device material is a semiconductor material, the circuitry comprising field effect transistors (FETs), the first metal in the first regions being respective gates of the FETs.

15. The method of making templated circuitry of claim 11, wherein the device material is a semiconductor material, and wherein depositing the device material comprises doping the semiconductor material to create a vertically stacked semiconductor junction, the circuitry comprising a diode and first region conductor traces at the first level insulated from the diode.

16. The method of making templated circuitry of claim 11, wherein the device material is a semiconductor material, the method further comprising selectively removing the insulator material exposed in the gap before the device material is deposited, and wherein depositing the device material comprises doping the semiconductor material to form a vertically stacked semiconductor junction, the circuitry comprising bipolar junction transistors (BJTs), the first metal in the first regions being respective bases of the BJTs.

\* \* \* \* \*